(12) United States Patent
Kim et al.

(10) Patent No.: US 8,686,423 B2
(45) Date of Patent: Apr. 1, 2014

(54) THIN FILM TRANSISTOR SUBSTRATE AND MANUFACTURING METHOD THEREOF

(75) Inventors: Sung-Ryul Kim, Cheonan-si (KR); Jean-Ho Song, Seoul (KR); Jae-Hyoung Youn, Seoul (KR); O-Sung Seo, Seoul (KR); Byeong-Beom Kim, Suwon-si (KR); Je-Hyeong Park, Hwaseong-si (KR); Jong-In Kim, Suwon-si (KR); Jae-Jin Song, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/604,082

(22) Filed: Sep. 5, 2012

(65) Prior Publication Data

US 2013/0001567 A1    Jan. 3, 2013

Related U.S. Application Data

(62) Division of application No. 12/821,668, filed on Jun. 23, 2010, now Pat. No. 8,304,299.

(30) Foreign Application Priority Data

Nov. 10, 2009  (KR) .................. 10-2009-0108026

(51) Int. Cl.
*H01L 31/00*    (2006.01)

(52) U.S. Cl.
USPC ......... 257/59; 257/72; 257/347; 257/E33.053

(58) Field of Classification Search
USPC .................. 257/59, 66, 72, 347, E33.053
See application file for complete search history.

(56) References Cited

U.S. PATENT DOCUMENTS

| | | | |
|---|---|---|---|
| 6,765,270 B2 | 7/2004 | Chae | |
| 7,277,138 B2 | 10/2007 | Cho et al. | |
| 7,492,420 B2 | 2/2009 | Cho et al. | |
| 7,564,531 B2 | 7/2009 | Yasuda et al. | |
| 7,884,362 B2 * | 2/2011 | Jung et al. ...................... | 257/59 |
| 2006/0203181 A1 | 9/2006 | Han et al. | |

FOREIGN PATENT DOCUMENTS

| | | |
|---|---|---|
| JP | 08-248442 | 9/1996 |
| KR | 1020090037088 | 4/2009 |

* cited by examiner

*Primary Examiner* — Jack Chen
(74) *Attorney, Agent, or Firm* — F.Chau & Associates, LLC (57) ABSTRACT

A thin film transistor array panel according to an exemplary embodiment of the present invention comprises a substrate, a gate line formed on the substrate, a gate insulating layer formed on the gate line, a semiconductor layer formed on the gate insulating layer, and a data line formed on the semiconductor layer, wherein the data line comprises a lower data layer, an upper data layer, a data oxide layer, and a buffer layer, wherein the upper data layer and the buffer layer comprise a same material.

8 Claims, 8 Drawing Sheets

THIN FILM TRANSISTOR SUBSTRATE AND MANUFACTURING METHOD THEREOF

CROSS-REFERENCE TO RELATED APPLICATION

This application is a divisional application of U.S. application Ser. No. 12/821,668 filed Jun. 23, 2010, now U.S. Pat. No. 8,304,299 which claims priority to and the benefit of Korean Patent Application No. 10-2009-0108026 filed in the Korean Intellectual Property Office on Nov. 10, 2009, the disclosures of which are each hereby incorporated by reference in their entireties.

BACKGROUND OF THE INVENTION (a) Technical Field

The present invention relates to a thin film transistor array panel and a manufacturing method thereof.

(b) Discussion of the Related Art

A thin film transistor (TFT) array panel may be used as a circuit board for independently driving pixels in a liquid crystal display or an organic electro-luminescent (EL) display device. A thin film transistor array panel typically includes a scanning signal line or a gate line transmitting a scanning signal, an image signal line or a data line transmitting an image signal, a thin film transistor connected to the gate line and the data line, and a pixel electrode connected to the thin film transistor.

A thin film transistor typically includes a gate electrode formed on the gate wire, a source electrode formed on the data wire, a drain electrode, and a channel formed in a semiconductor layer between the source and drain electrodes. The thin film transistor is essentially a switching element that controls an image signal transmitted to the pixel electrode through the data wire in response to the scanning signal transmitted through the gate line.

In order to reduce the manufacturing time and cost during fabrication of a thin film transistor array panel, the number of fabrication processing steps using a mask can be reduced. For example, a four mask process for forming the data line and the semiconductor layer may be completed using only one mask. In the four mask process, when defects occur during the formation of a photosensitive film pattern, the defective photosensitive film pattern is removed and a new photosensitive film pattern is formed. The repeated formation of a photosensitive film pattern on the data line, may comprise copper or a copper alloy, may result in damage to the data line. For example, the data line may be easily disconnected at a portion where the data line has a step. In addition, wet etching steps used during the four mask process further increase the possibility of the data line becoming disconnected during manufacture.

SUMMARY OF THE INVENTION

According to an exemplary embodiment of the present invention, a thin film transistor array panel may include a substrate, a gate line formed on the substrate, a gate insulating layer formed on the gate line, a semiconductor layer formed on the gate insulating layer, and a data line formed on the semiconductor layer, wherein the data line comprises a lower data layer, an upper data layer, a data oxide layer, and a buffer layer, wherein the upper data layer and the buffer layer comprise a same material.

The lower data layer may comprise one of titanium or a titanium alloy.

The lower data layer, the upper data layer, the data oxide layer, and the buffer layer may be sequentially deposited.

An inclination angle of a side surface of the upper data layer may be different from an inclination angle of a side surface of the data oxide layer.

An inclination angle of a side surface of the buffer layer may be different from an inclination angle of a side surface of the data oxide layer.

The thickness of the buffer layer may be no less than about 10 Å and no more than about 1000 Å.

The data line may comprise a source electrode and a drain electrode, and the semiconductor layer may comprise a channel disposed between the source electrode and the drain electrode.

A side surface of the lower data layer and a side surface of the upper data layer may comprise a step shape.

The upper data layer and the buffer layer may comprise one of copper or a copper alloy.

According to an exemplary embodiment of the present invention, a method for manufacturing a thin film transistor array panel comprises forming a gate line on a substrate, forming a gate insulating layer on the gate line, sequentially forming an amorphous silicon layer, a lower data metal layer, and an upper data metal layer on the gate insulating layer, forming a first photosensitive film pattern on the upper data metal layer, removing the first photosensitive film pattern if defects in the first photosensitive film pattern are present, forming a buffer metal layer on the upper data metal layer, and forming a second photosensitive film pattern on the buffer metal layer.

The method may further comprise sequentially forming an amorphous silicon layer doped with impurities on the amorphous silicon layer.

In an exemplary embodiment, the first and second photosensitive film patterns each comprise first and second portions having different thicknesses.

In an exemplary embodiment, the first photosensitive film pattern is removed using an organic solvent.

In an exemplary embodiment, a residue of the first photosensitive film pattern on the upper data metal layer is removed using one of a hydrogen fluoride (HF) or an organic solvent.

The method may further comprise forming a data oxide layer on the upper data metal layer prior to forming the buffer metal layer.

The method may further comprise etching the upper and lower data metal layers via a first wet etching process, using the first photosensitive film pattern as a mask.

The method may further comprise etching the amorphous silicon layer via a first dry etching process, using the second photosensitive film pattern as a mask.

The method may further comprise forming a third photosensitive film pattern by ashing the second photosensitive film pattern, and etching the upper data metal layer and the buffer metal layer via a second wet etching process, using the third photosensitive film pattern as a mask.

The method may further comprise etching the lower data metal layer and the amorphous silicon layer via a second dry etching process, using the third photosensitive pattern as a mask.

The method may further comprise removing the third photosensitive pattern, forming a passivation layer on the substrate, forming a contact hole in the passivation layer exposing a drain electrode, and forming a pixel electrode on the passivation layer and in the contact hole.

DETAILED DESCRIPTION OF THE EXEMPLARY EMBODIMENTS

Figure 1:
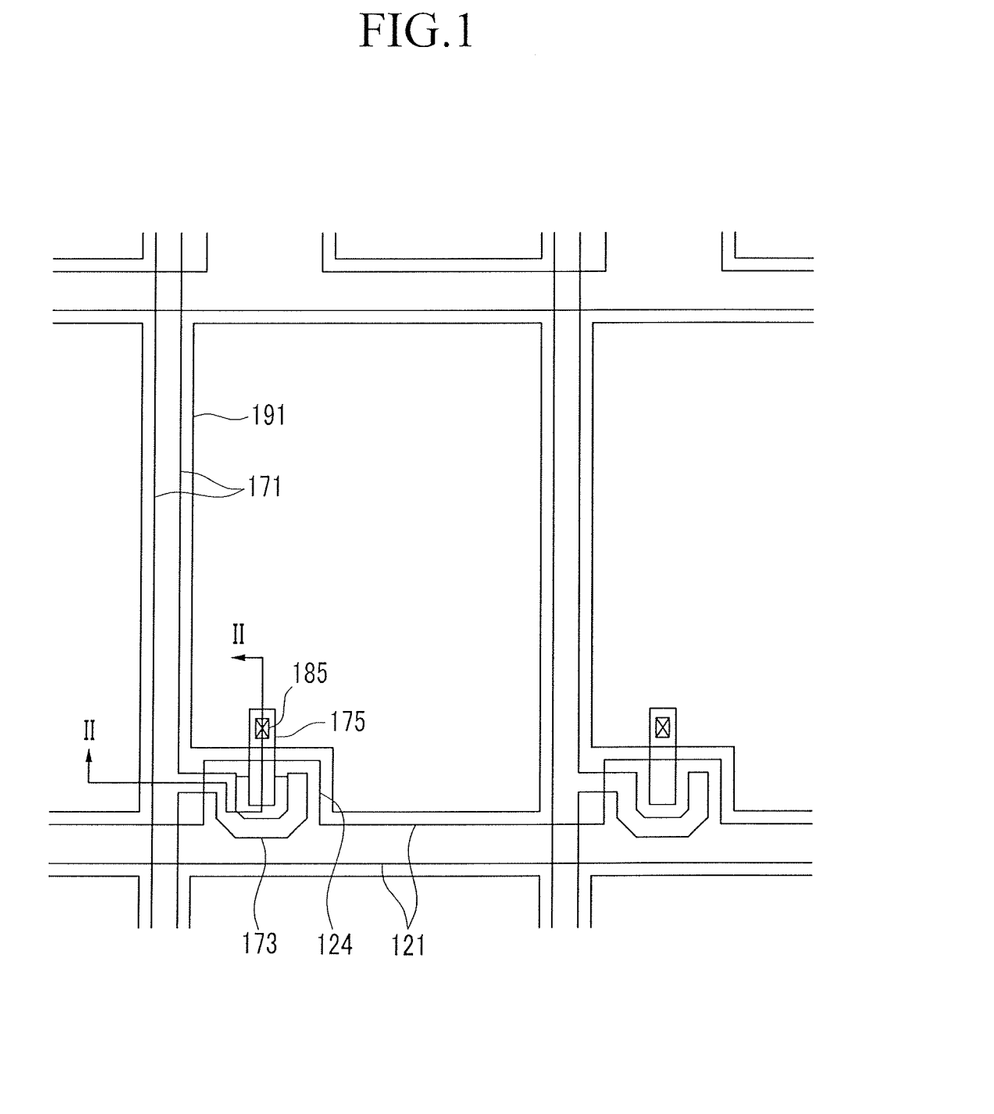
FIG. 1 is a layout view of a thin film transistor array panel according to an exemplary embodiment of the present invention.
Figure 2:
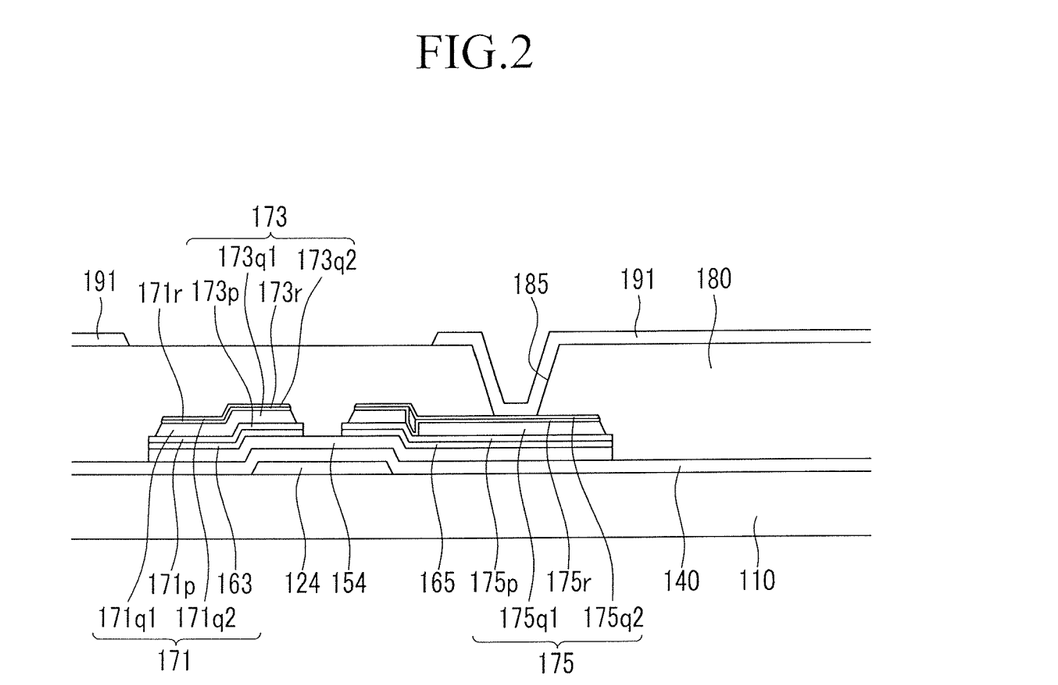
FIG. 2 is a cross-sectional view taken along the line II-II of FIG. 1.

Exemplary embodiments of the present invention will be described more fully hereinafter with reference to the accompanying drawings. The invention may, however, be embodied in many different forms and should not be construed as limited to the exemplary embodiments set forth herein. In the drawings, the thickness of layers, films, panels, regions, etc., may be exaggerated for clarity. Like reference numerals designate like elements throughout the drawings. It will be understood that when an element such as a layer, film, region, or substrate is referred to as being "on" another element, it can be directly on the other element or intervening elements may also be present. FIG. 1 is a layout view of a thin film transistor array panel according to an exemplary embodiment of the present invention. FIG. 2 is a cross-sectional view taken along line II-II of FIG. 1, illustrating a thin film transistor on the thin film transistor array panel.

Referring to FIGS. 1 and 2, a plurality of gate lines 121 including gate electrodes 124, a gate insulating layer 140, a plurality of semiconductor layers 154, a plurality of ohmic contacts 163 and 165, a plurality of data lines 171, and a plurality of drain electrodes 175 are sequentially formed on a substrate 110 made of an insulating material such as, for example, glass or plastic.

The gate lines 121 transmit a gate signal and extend in a substantially transverse direction, and the data lines 171 transmit a data signal and extend in a substantially longitudinal direction, intersecting the gate lines 121. Each data line 171 includes a plurality of source electrodes 173 extending from the data line 171 towards the plurality of gate electrodes 124. The drain electrodes 175 are separated from the data lines 171 and are located opposite the source electrodes 173 with respect to the gate electrodes 124.

The data lines 171, the source electrodes 173, and the drain electrodes 175 include lower data layers 171p, 173p, and 175p, upper data layers 171q1, 173q1, and 175q1, data oxide layers 171r, 173r, and 175r, and buffer layers 171q2, 173q2, and 175q2. The lower data layers 171p, 173p, and 175p may comprise, for example, titanium (Ti) or a titanium alloy, and the thickness of these layers may be, for example, about 100 Å to about 500 Å, however, the material and thickness of these layers is not limited thereto. The upper data layers 171q1, 173q1, and 175q1 may comprise, for example, copper (Cu) or a copper alloy, and the thickness of these layers may be, for example, about 1000 Å to about 5000 Å, however, the material and thickness of these layers is not limited thereto.

The data oxide layers 171r, 173r, and 175r may comprise, for example, CuOx, including copper or a copper alloy. The buffer layers 171q2, 173q2, and 175q2 are made of the same material as the upper data layers 171q1, 173q1, and 175q1 and may comprise, for example, copper or a copper alloy. A thickness of the buffer layers 171q2, 173q2, and 175q2 less than about 10 Å may result in the signal line becoming damaged and disconnected during the etching process, while a thickness of the buffer layers 171q2, 173q2, and 175q2 more than about 1000 Å may cause deterioration of an applied pattern during the etching process because the metal may not be easily etched. As a result, exemplary embodiments of the present invention comprise buffer layers 171q2, 173q2, and 175q2 having a thickness of about 10 Å to about 1000 Å.

The side surfaces of the layers comprising the data lines 171, the source electrodes 173, and the drain electrodes 175 may be inclined at an angle of about 30 to about 80 degrees with respect to the surface of the substrate 110, however, the inclination angles of the side surfaces of the layers is not limited thereto. The side surfaces of each of the layers may have different inclination angles. For example, the inclination angles of the side surfaces of the upper data layers 171q1, 173q1, and 175q1 and the data oxide layers 171r, 173r and 175r may be different from each other, and the inclination angles of the side surfaces of the buffer layers 171q2, 173q2, and 175q2 and the data oxide layers 171r, 173r, and 175r may be different from each other. As a result, the upper data layers 171q1, 173q1, and 175q1 and the buffer layers 171q2, 173q2, and 175q2 are made of copper (Cu) or a copper alloy, while the data oxide layers 171r, 173r, and 175r are made of a copper oxide layer, allowing the etch ratios of the layers to be different from each other for purposes of wet etching.

The semiconductor layers 154 are positioned on the gate electrodes 124 and include a channel between the source electrode 173 and the drain electrode 175. The data lines 171, which are formed on the semiconductor layers 154, have a similar pattern shape as the semiconductor layers 154, except for the portion of the data lines 171 not formed in the channel, as illustrated in FIG. 2.

In an exemplary embodiment, the side surfaces of the lower data layers 171p, 173p, and 175p are different from the side surfaces of the upper data layers 171q1, 173q1, and 175q1. For example, as illustrated in FIG. 2, the side surfaces of the lower data layers 171p, 173p, and 175p may be substantially even with the edges/boundaries of the semiconductor layer 154, while the side surfaces of the upper data layers 171q1, 173q1, and 175q1 may comprise a step shape with respect to the edges/boundaries of the semiconductor layer 154 and the lower data layers 171p, 173p and 175p. Because of the step shape of the side surfaces of the upper data layers 171q1, 173q1, and 175q1, wet etching is used when etching these layers.

As shown in FIG. 2, ohmic contacts 163 and 165 are only disposed on the semiconductor layers 154 between the semiconductor layers 154 and the data lines 171, and between the semiconductor layers 154 and drain electrodes 175. As a result, contact resistance is reduced between the semiconductor layers 154 and the data lines 171 and the semiconductor layers 154 and the drain electrodes 175.

A gate electrode 124, a source electrode 173, a drain electrode 175, and the semiconductor layer 154 form a thin film transistor. The channel of the thin film transistor is formed in the semiconductor layer 154 between the source electrode 173 and the drain electrode 175.

A passivation layer 180 is formed on the data lines 171 and the drain electrodes 175. The passivation layer 180 may comprise, for example, silicon nitride or silicon oxide.

The passivation layer 180 has a contact hole 185 exposing the drain electrode 175. A pixel electrode 191 is connected to the drain electrode 175 through the contact hole 185.

A manufacturing method of a thin film transistor array panel according to an exemplary embodiment of the present invention will be described with reference to FIGS. 3-13, as well as FIGS. 1-2.

FIGS. 3-13 are cross-sectional views sequentially showing a manufacturing method of a thin film transistor array panel according to an exemplary embodiment of the present invention.

Figure 3:
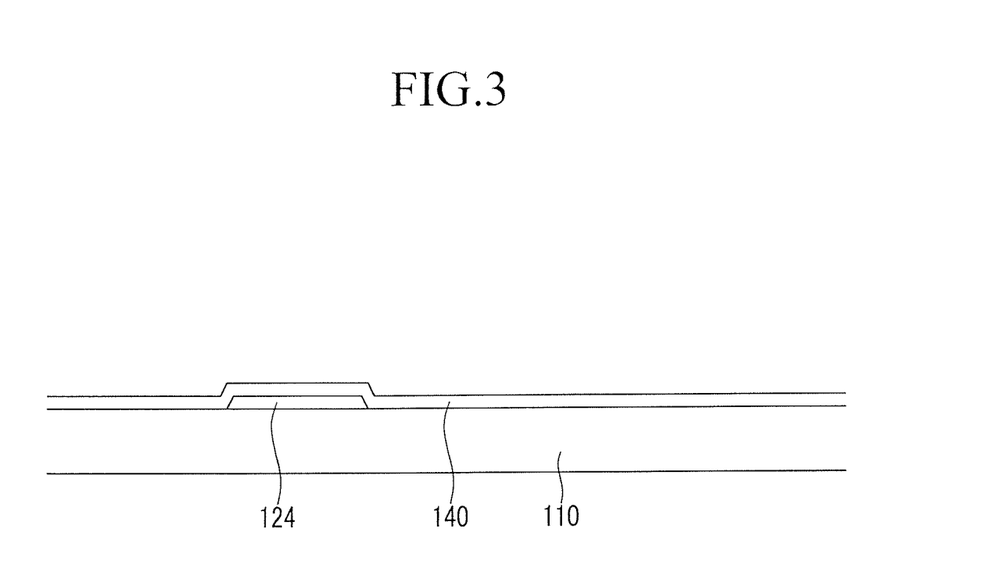
FIGS. 3-13 are cross-sectional views sequentially showing a manufacturing method of a thin film transistor array panel according to an exemplary embodiment of the present invention.

As shown in FIG. 3, a gate electrode 124 is formed on a transparent insulation substrate 110, and a gate insulating layer 140 is formed on the insulation substrate 110.

Figure 4:
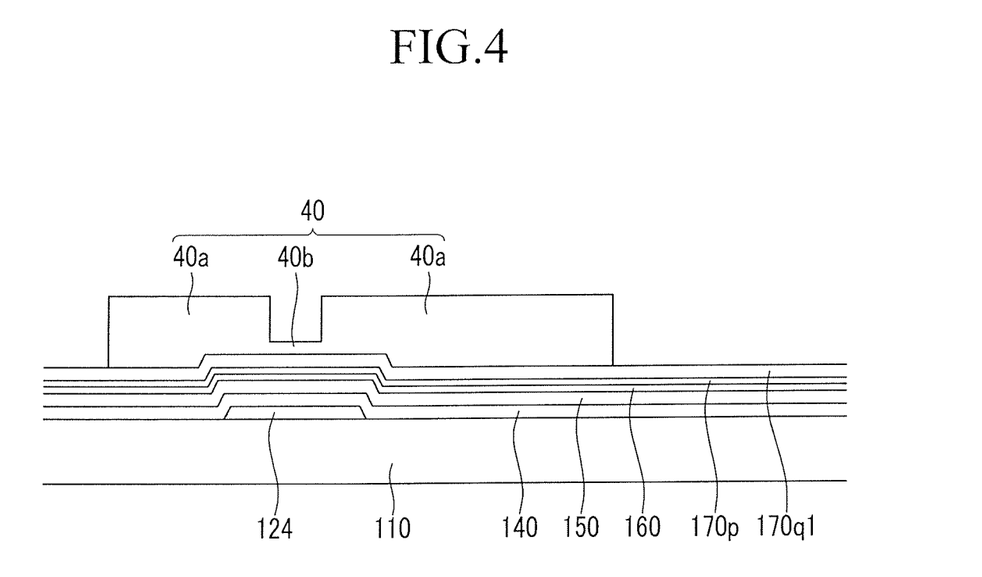

In FIG. 4, an amorphous silicon layer 150, an amorphous silicon layer 160 doped with impurities, and a data metal layer 170 are sequentially deposited on the gate insulating layer 140. The data metal layer 170 may include a lower data metal layer 170$p$ comprising, for example, titanium (Ti) or a titanium alloy, and an upper data metal layer 170$q$1 comprising, for example, copper (Cu) or a copper alloy, however, the lower data metal layer 170$p$ and upper data metal layer 170$q$1 are not limited thereto.

A first photosensitive film pattern 40 is deposited on the upper data metal layer 170$q$1. The first photosensitive film pattern 40 includes a first portion 40$a$ and a second portion 40$b$ having different thicknesses, as illustrated in FIG. 4.

The first photosensitive film pattern 40 may be formed, for example, by coating, exposing, and developing a photosensitive film (not shown) by using a half-tone mask having a light transmittance region, a translucent region, and a light blocking region. The translucent region of the half-tone mask may be formed by using a semi-transparent layer or slit patterns.

After formation, the first photosensitive film pattern 40 is inspected. If defects occurred during the formation of the first photosensitive film pattern 40, the first photosensitive film pattern 40 is removed using an organic solvent.

Figure 5:
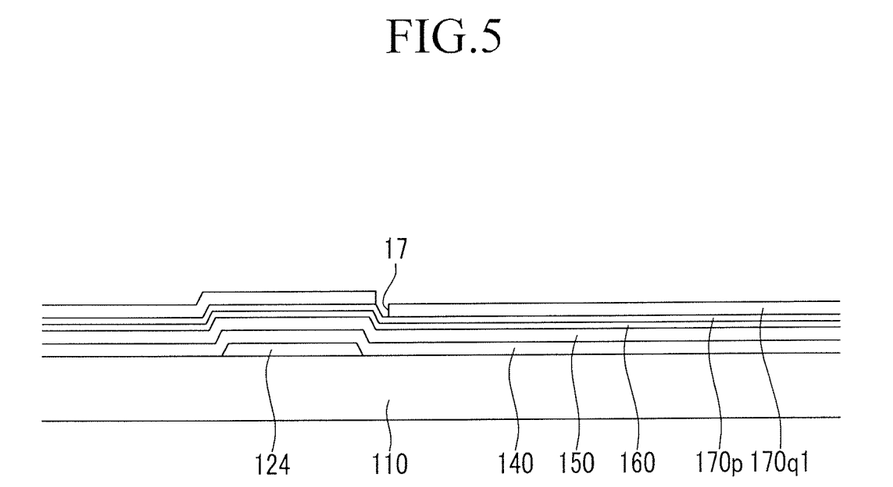

The organic solvent used to remove the first photosensitive film pattern 40 may damage the upper data metal layer 170$q$1 disposed under the first photosensitive film pattern 40. For example, the upper data metal layer 170$q$1 may be disconnected (e.g., a disconnection portion 17) where the step is formed in the upper data metal layer 170$q$1, as illustrated in FIG. 5

The upper data metal layer 170$q$1, which may comprise, for example, copper (Cu) or a copper alloy, may absorb organic materials. As a result, residues of the first photosensitive film pattern 40 may remain on the upper data metal layer 170$q$1 after the first photosensitive film pattern 40 has been removed. These residues may be removed from the upper data metal layer 170$q$1 using, for example, hydrogen fluoride (HF) or an organic solvent.

Figure 6:
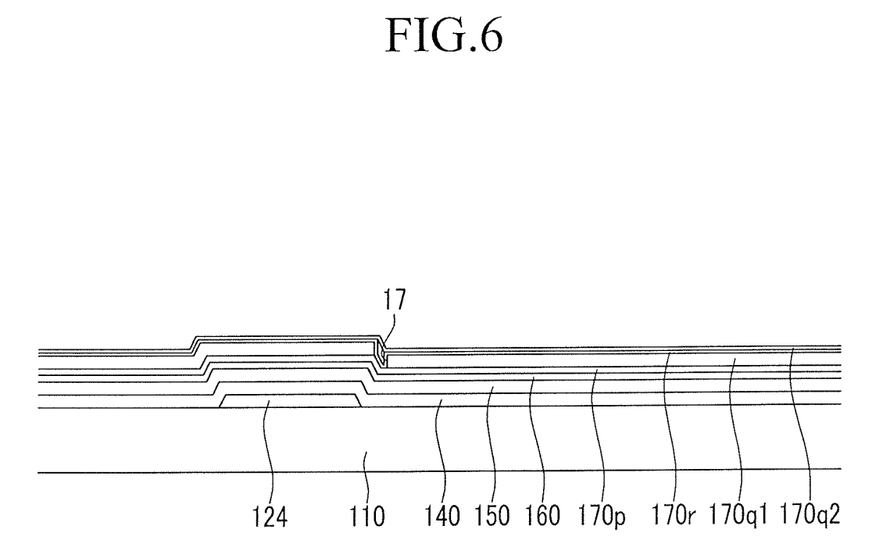
Figure 7:
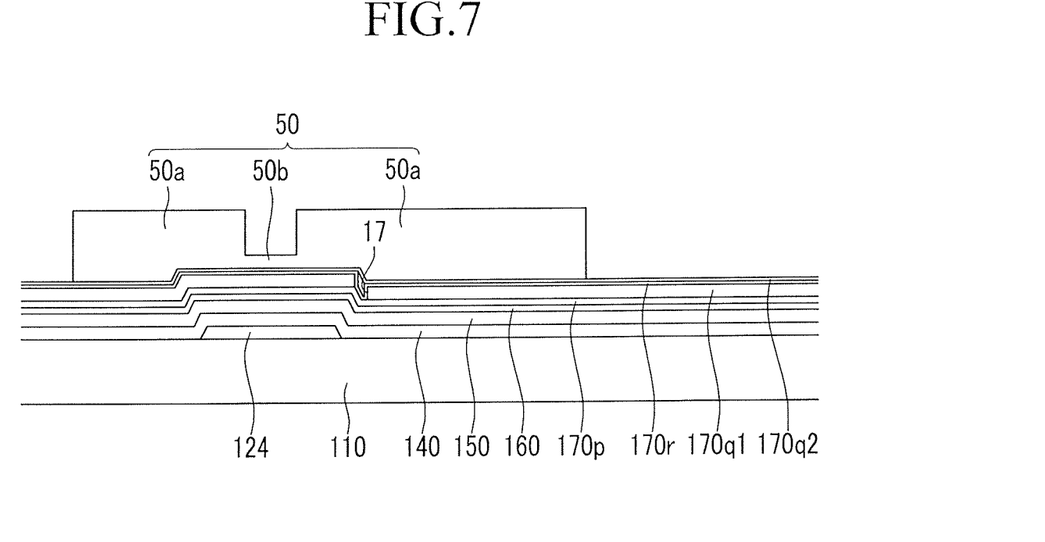

As shown in FIG. 6, a buffer metal layer 170$q$2 is formed on the upper data metal layer 170$q$1. The buffer metal layer 170$q$2 may have a thickness of about 10 Å to about 1000 Å, however, the thickness of the buffer metal layer 170$q$2 is not limited thereto. In an exemplary embodiment of the present invention, a data oxide layer 170$r$ may be formed on the exposed upper data metal layer 170$q$1 before formation of the buffer metal layer 170$q$2. As shown in FIG. 7, a second photosensitive film pattern 50 is deposited on the buffer metal layer 170$q$2. The second photosensitive film pattern 50 includes a first portion 50$a$ and a second portion 50$b$ having different thicknesses. The second photosensitive film pattern 50 may be formed using formation techniques as described with reference to the first photosensitive film pattern 40. Because the buffer metal layer 170$q$2 has strong adherence with the second photosensitive film pattern 50, the etchant is prevented from penetrating into the buffer metal layer 170$q$2 and the upper data metal layer 170$q$1 during the etching process.

Figure 8:
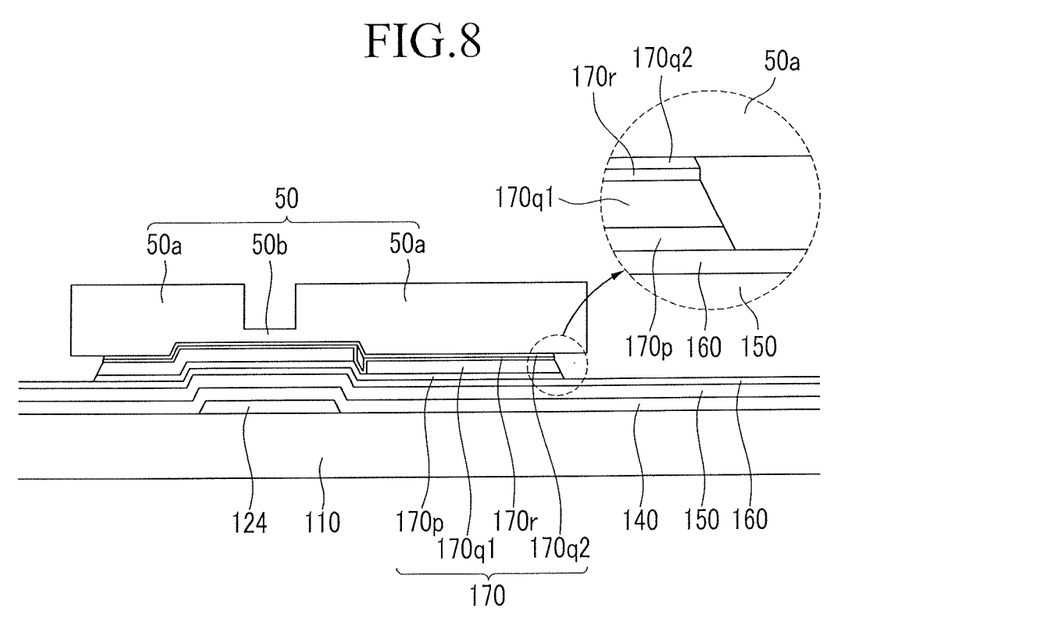

As shown in FIG. 8, the second photosensitive film pattern 50 is used as a mask during a first wet etching process, in which the data metal layer 170 is etched.

The data metal layer 170 is under-cut below the second photosensitive film pattern 50. The inclination angles of the side surfaces of the upper data metal layer 170$q$1 and the data oxide layer 170$r$ may be different from each other, and the inclination angles of the side surfaces of the buffer metal layer 170$q$2 and the data oxide layer 170$r$ may be different from each other. For example, as shown in FIG. 8, the side surfaces of the upper data metal layer 170$q$1 and the buffer metal layer 170$q$2 may be inclined at an oblique angle with respect to the substrate 110, while the side surface of the data oxide layer 170$r$ may be substantially perpendicular to the substrate 110. As a result, the upper data metal layer 170$q$1 and the buffer metal layer 170$q$2 are made of copper (Cu) or a copper alloy, while the data oxide layer 170$r$ is made of a copper oxide layer, allowing the etch ratios of the layers to be different from each other for purposes of wet etching.

Figure 9:
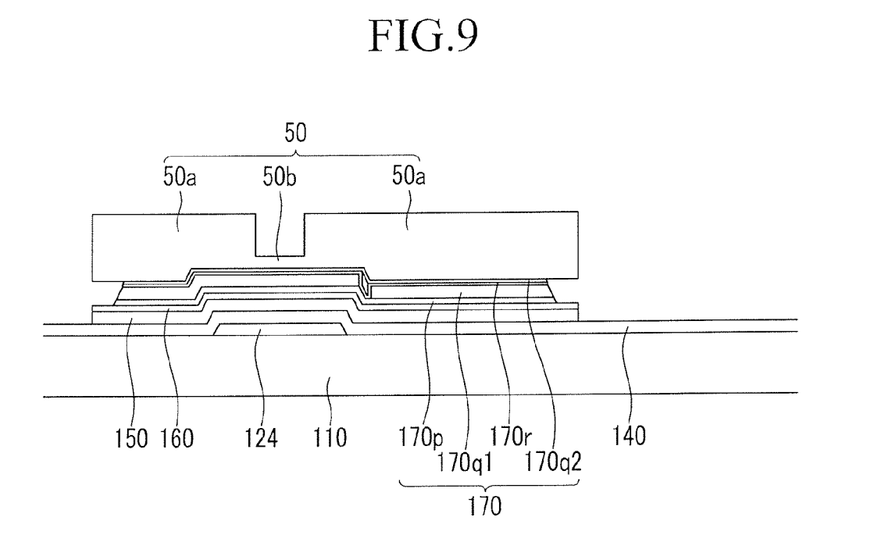

As shown in FIG. 9, the second photosensitive film pattern 50 is used as a mask during a first dry etching process, in which the amorphous silicon layer 150 and the doped amorphous silicon layer 160 are etched.

Figure 10:
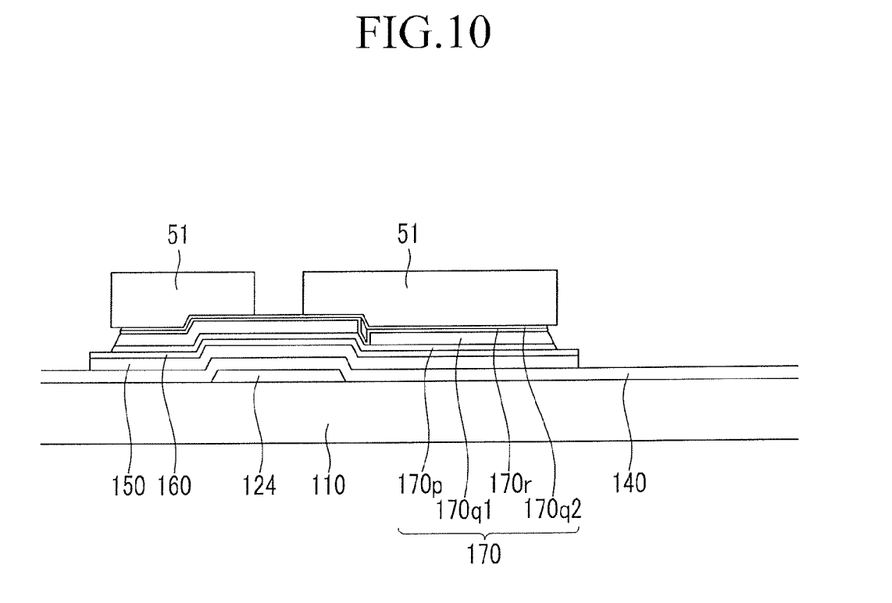

As shown in FIG. 10, a third photosensitive film pattern 51 is formed by ashing the second photosensitive film pattern 50 to remove a part of the first portion 50$a$ and substantially all of the second portion 50$b$ of the pattern. The third photosensitive film pattern 51 exposes a portion corresponding to the channel of the thin film transistor, which is formed later.

Figure 11:
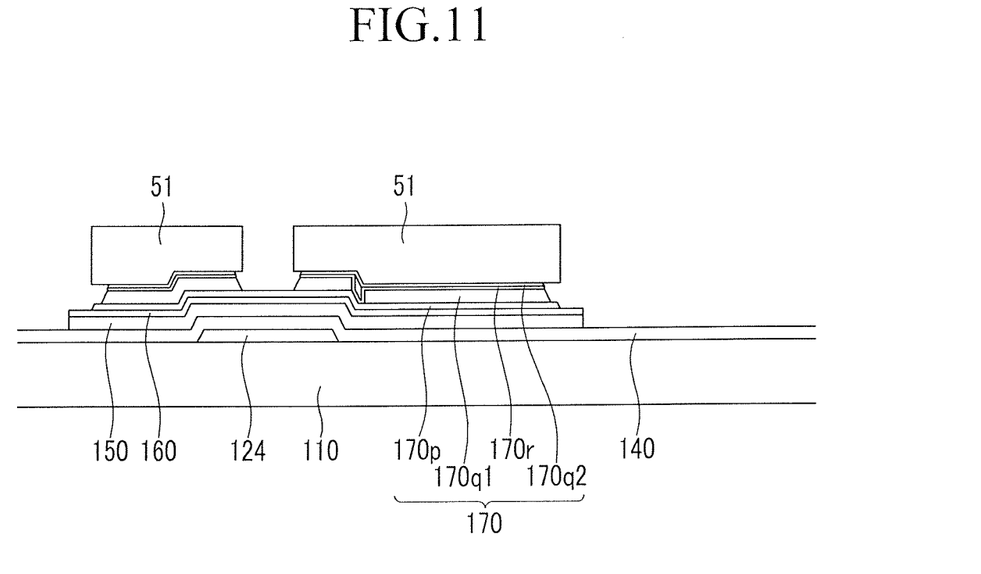

As shown in FIG. 11, the third photosensitive film pattern 51 is used as a mask during a second wet etching process, in which the upper data metal layer 170$q$1, the data oxide layer 170$r$, and the buffer metal layer 170$q$2 are etched. A portion corresponding to the channel of the thin film transistor, which is formed later, is exposed.

Figure 12:
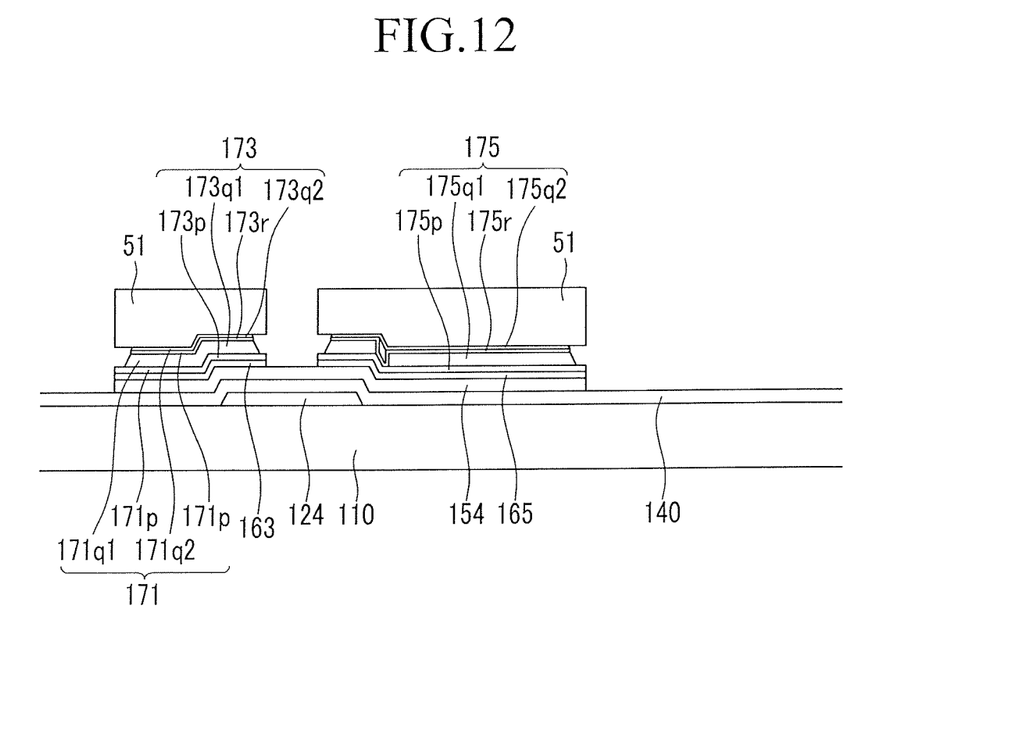

As shown in FIG. 12, the third photosensitive film pattern 51 is used as a mask during a second dry etching process, in which the lower data metal layer 170$p$, the doped amorphous silicon layer 160, and the amorphous silicon layer 150 are etched.

In the second dry etching process, the lower data metal layer 170$p$ is etched using the third photosensitive film pattern 51 as a mask. A portion of the doped amorphous silicon layer 160 and the amorphous silicon layer 150 may also be etched.

The doped amorphous silicon layer 160 is etched using the third photosensitive film pattern 51 as the mask, exposing a portion of the amorphous silicon layer 150.

A portion of the amorphous silicon layer 150 corresponding to the channel of the thin film transistor is etched, forming a data line 171 comprising a source electrode 173, a drain electrode 175, ohmic contact layers 163 and 165, and a semiconductor layer 154.

Figure 13:
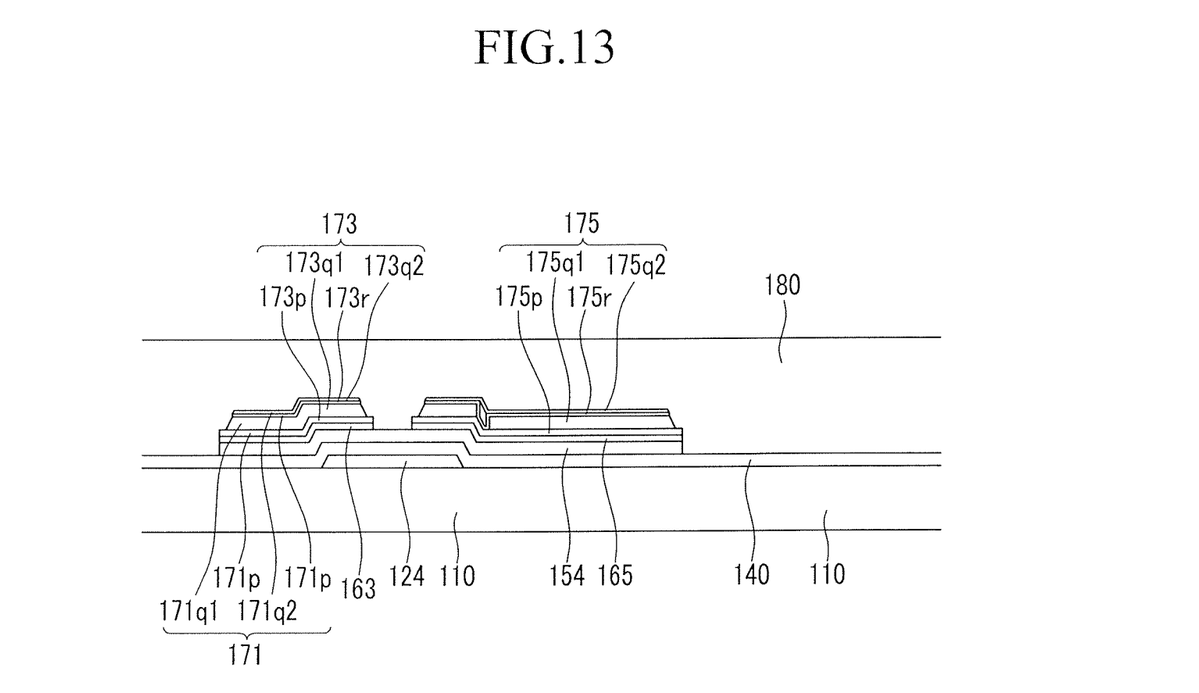

As shown in FIG. 13, after removal of the third photosensitive film pattern 51, a passivation layer 180 is formed on the entire surface of the substrate, including the data line 171, the drain electrode 175, and the gate insulating layer 140.

Referring again to FIG. 2, a contact hole 185 exposing the drain electrode 175 is formed in the passivation layer 180, and a pixel electrode 191 is formed thereon.

Although exemplary embodiments of the present invention have been described hereinabove, it should be understood that the present disclosure is not limited to these embodiments, but may be modified by those skilled in the art without departing from the spirit and scope of the present invention, as defined by the appended claims.

What is claimed is:
1. A thin film transistor array panel comprising:
a substrate;
a gate line formed on the substrate;
a gate insulating layer formed on the gate line;
a semiconductor layer formed on the gate insulating layer; and a data line formed on the semiconductor layer, wherein the data line comprises a lower data layer, an upper data layer, a data oxide layer, and a buffer layer, wherein the lower data layer, the upper data layer, and the buffer layer comprise metal, wherein the upper data layer and the buffer layer comprise a same material, wherein an inclination angle of a side surface disposed at an end portion of the upper data layer is different from an inclination angle of a side surface disposed at an end portion of the data oxide layer.

2. The thin film transistor array panel of claim 1, wherein the lower data layer comprises one of titanium or a titanium alloy.

3. The thin film transistor array panel of claim 1, wherein the lower data layer, the upper data layer, the data oxide layer, and the buffer layer are sequentially deposited.

4. The thin film transistor array panel of claim 1, wherein a thickness of the buffer layer is no less than about 10 Å and no more than about 1000 Å.

5. The thin film transistor array panel of claim 1, wherein the data line comprises a source electrode and a drain electrode, and the semiconductor layer comprises a channel disposed between the source electrode and the drain electrode.

6. The thin film transistor array panel of claim 1, wherein a side surface of the lower data layer and a side surface of the upper data layer comprise a step shape.

7. The thin film transistor array panel of claim 1, wherein the upper data layer and the buffer layer comprise one of copper or a copper alloy.

8. A thin film transistor array panel comprising:

a substrate;

a gate line formed on the substrate;

a gate insulating layer formed on the gate line;

a semiconductor layer formed on the gate insulating layer; and a data line formed on the semiconductor layer, wherein the data line comprises a lower data layer, an upper data layer, a data oxide layer, and a buffer layer, wherein the lower data layer, the upper data layer, and the buffer layer comprise metal, wherein the upper data layer and the buffer layer comprise a same material, wherein an inclination angle of a side surface disposed at an end portion of the buffer layer is different from an inclination angle of a side surface disposed at an end portion of the data oxide layer.

* * * * *